United States Patent
Rim et al.

(10) Patent No.: US 8,822,257 B2
(45) Date of Patent: *Sep. 2, 2014

(54) THIN SILICON SOLAR CELL AND METHOD OF MANUFACTURE

(71) Applicant: SunPower Corporation, San Jose, CA (US)

(72) Inventors: Seung Bum Rim, Palo Alto, CA (US); Michael Morse, San Jose, CA (US); Taeseok Kim, San Jose, CA (US); Michael J. Cudzinovic, Sunnyvale, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/920,980

(22) Filed: Jun. 18, 2013

(65) Prior Publication Data

US 2014/0034128 A1  Feb. 6, 2014

(51) Int. Cl.
*H01L 21/00* (2006.01)
*H01L 31/18* (2006.01)
*H01L 21/02* (2006.01)
*H01L 31/068* (2012.01)
*H01L 31/0264* (2006.01)

(52) U.S. Cl.
CPC ............ *H01L 31/0264* (2013.01); *H01L 31/18* (2013.01); *H01L 21/02381* (2013.01); *H01L 31/0682* (2013.01); *H01L 21/02532* (2013.01); *H01L 21/0245* (2013.01); *Y02E 10/547* (2013.01); *H01L 21/02513* (2013.01); *Y02E 10/546* (2013.01); *H01L 21/02494* (2013.01); *H01L 31/182* (2013.01)
USPC ................ 438/57; 438/73; 136/252; 136/256

(58) Field of Classification Search
CPC ..... Y02E 10/50; Y02E 10/543; Y02E 10/544; H01L 31/02167; H01L 31/0224; H01L 31/02168; H01L 31/02008
USPC .......... 438/48, 57, 73, 71; 136/206, 244, 249, 136/252, 255, 256
See application file for complete search history.

(56) References Cited

U.S. PATENT DOCUMENTS

| | | | |
|---|---|---|---|
| 8,486,746 B2 * | 7/2013 | Rim et al. ........................ | 438/57 |
| 2010/0084729 A1 * | 4/2010 | Steinbrueck et al. ......... | 257/434 |
| 2011/0056532 A1 * | 3/2011 | Ravi et al. ..................... | 136/244 |

* cited by examiner

*Primary Examiner* — Khiem D Nguyen
(74) *Attorney, Agent, or Firm* — Okamoto & Benedicto LLP

(57) ABSTRACT

A method of fabricating a solar cell is disclosed. The method includes the steps of forming a sacrificial layer on a silicon substrate, forming a doped silicon layer atop the sacrificial substrate, forming a silicon film atop the doped silicon layer, forming a plurality of interdigitated contacts on the silicon film, contacting each of the plurality of interdigitated contacts with a metal contact, and removing the sacrificial layer.

11 Claims, 5 Drawing Sheets

THIN SILICON SOLAR CELL AND METHOD OF MANUFACTURE

REFERENCE TO RELATED APPLICATION

This application is a continuation of U.S. application Ser. No. 13/074,350, filed on Mar. 29, 2011, issued as U.S. Pat. No. 8,486,746, which is incorporated herein by reference in its entirety.

TECHNICAL FIELD

Embodiments of the subject matter described herein relate generally to solar cell manufacture. More particularly, embodiments of the subject matter relate to thin silicon solar cells and techniques for manufacture.

BACKGROUND

Solar cells are well known devices for converting solar radiation to electrical energy. They may be fabricated on a semiconductor wafer using semiconductor processing technology. A solar cell includes P-type and N-type diffusion regions. Solar radiation impinging on the solar cell creates electrons and holes that migrate to the diffusion regions, thereby creating voltage differentials between the diffusion regions. In a back contact, back junction (BCBJ) solar cell, the P-type and N-type diffusion regions and the metal contacts coupled to them are on the backside of the solar cell. The metal contacts allow an external electrical circuit to be coupled to and be powered by the solar cell.

To compete with other energy sources available on the market, solar cells not only have to be efficient but also fabricated at relatively low cost and high yield. Although solar cells can be fabricated using silicon processing steps, operations performed on a silicon wafer necessarily occur after the wafer has been created. Creating silicon wafers for solar cells typically can include, for example, forming a silicon material, shaping the silicon material into an ingot, and wafering the ingot to form silicon wafers. Embodiments of the present invention pertain to novel solar cell fabrication processes and structures that reduce the cost of solar cell fabrication.

BRIEF SUMMARY

A method of fabricating a solar cell is disclosed. The method includes the steps of forming a sacrificial layer on a silicon substrate, forming a doped silicon layer atop the sacrificial substrate, forming a silicon film atop the doped silicon layer, forming a plurality of interdigitated contacts on the silicon film, contacting each of the plurality of interdigitated contacts with a metal contact, and removing the sacrificial layer.

Another method of fabricating a solar cell is disclosed. The method comprises the steps of forming a sacrificial layer on a top surface of a silicon substrate, processing the exposed surface of the sacrificial layer to form a textured surface, forming a heavily doped silicon layer atop the textured surface of the sacrificial substrate, forming a lesser doped silicon layer atop the heavily doped silicon layer, epitaxially growing a silicon film atop the lesser doped silicon layer, forming an interdigitated contact structure atop the silicon film, bonding the silicon film to a carrier, separating the heavily doped silicon layer from the silicon substrate by removing the sacrificial layer, debonding the silicon film from the carrier, and forming an anti-reflective coating over the heavily doped silicon layer.

Yet another method of fabricating a solar cell is disclosed. The method comprises forming a sacrificial layer on a silicon substrate, forming a doped silicon layer atop the sacrificial substrate, forming a silicon film atop the doped silicon layer, forming a plurality of interdigitated contacts on the silicon film, and separating the doped silicon layer from the silicon substrate.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

One technique for reducing the cost of fabricating a solar cell can be to omit the steps of the process necessary to create the silicon wafer which is processed during traditional photovoltaic solar cell manufacture. To omit the wafer creation steps, the silicon substrate which forms the bulk of the solar cell can be epitaxially grown, together with the other constituent parts of a photovoltaic solar cell, on a sacrificial layer of material. The sacrificial layer can then be removed, detaching the completed, grown solar cell from the formative platform.

The various tasks performed in connection with the fabrication techniques shown in FIGS. 2-13 may include any number of additional or alternative tasks, the fabrication shown in FIGS. 2-13 need not be performed in the illustrated order, and the fabrication process may be incorporated into a more comprehensive procedure or process having additional functionality not described in detail herein.

Figure 1:
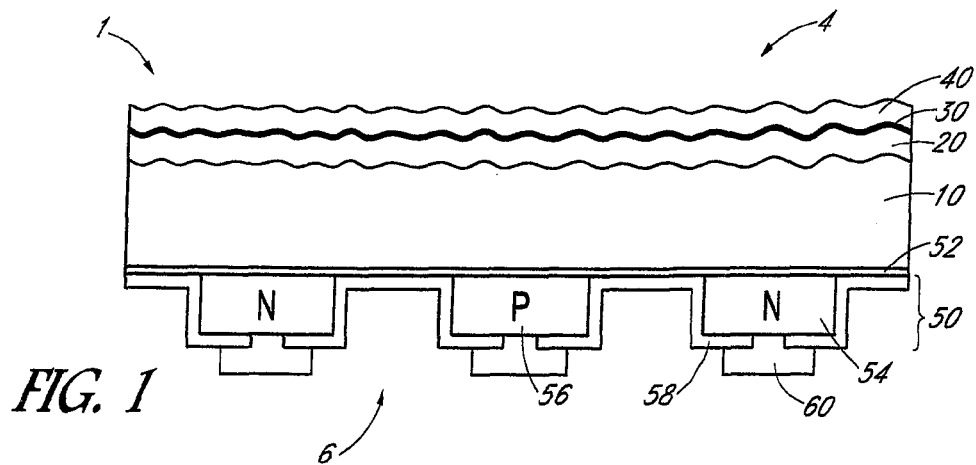
FIG. 1 is a cross-sectional view of a thin silicon solar cell in accordance with an embodiment of the invention.

FIG. 1 illustrates a solar cell 1 formed with a thin silicon substrate 10. The solar cell 1 comprises the thin silicon substrate 10, a lightly doped region 20, a heavily doped region 30, and anti-reflective coating (ARC) 40, and a contact structure

50. The solar cell has a first, sunny side 4, which faces the sun during normal operation, and a second, back side 6, which faces away. It should be appreciated that the sunny side-facing surfaces of the thin silicon substrate 10, the lightly and heavily doped regions 20, 30, and the ARC 40 have a random, textured surface which improves the performance of the solar cell 1 in capturing light received on the sunny side 4. These textured surfaces can have truly random shapes, such as those caused by wet etching a material with surface defects, or a repeating geometric shape, such as a triangular or rectangular pyramidal shape.

The contact structure 50 can include alternating N and P doped regions 54, 56 formed atop a thin oxide layer 52. The N and P doped regions 54, 56 can be covered by an insulating layer 58, such as an oxide or polyimide, or other insulating material. A contact 60 can be formed through a hole in the insulating layer 58 to provide electrical contact with each of the doped regions 54, 56. The contact 60 can be a single metal, such as copper or aluminum, or a stack of different metals, including tungsten, as desired for the embodiment, and explained in further detail below. The solar cell 1 can be formed, as shown in the embodiment illustrated in FIG. 1, as a back contact, back junction (BCBJ) solar cell. The solar cell 1 can include any of several different contact structures 50 as desired for the embodiment, including different arrangements of the doped regions 54, 56 and the passivating oxides. The formation of the thin silicon substrate 10 can be accomplished by growing the layers toward the sunny side 4 of the solar cell 1 upwards from a sacrificial layer atop a substrate. In certain embodiments, the ARC layer 40 can be omitted during fabrication, and applied later.

FIGS. 2-11 illustrate a solar cell, such as that of the embodiment of FIG. 1, in sequential steps of fabrication of a thin silicon solar cell using an epitaxial growth technique.

Figure 2:
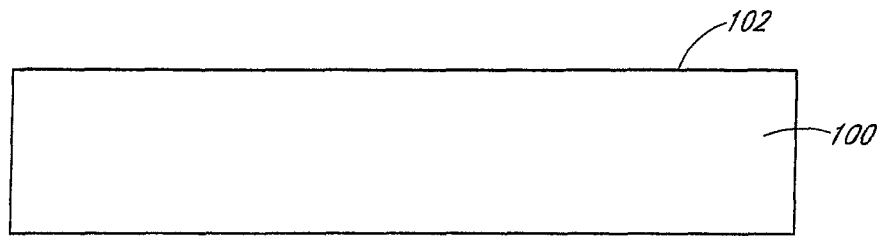
FIGS. 2-11 are cross-sectional representations of a solar cell being fabricated in accordance with an embodiment of the invention.

FIG. 2 illustrates a silicon substrate 100. The silicon substrate 100 can be composed of pure silicon, or can be doped or compound silicon. The silicon substrate 100 has an upper surface 102. The silicon substrate 100 can be a reusable part of the fabrication process. In certain embodiments, as described in greater detail below with respect to FIGS. 12 and 13, the silicon substrate 100 can include a plurality of thin layers.

Figure 3:
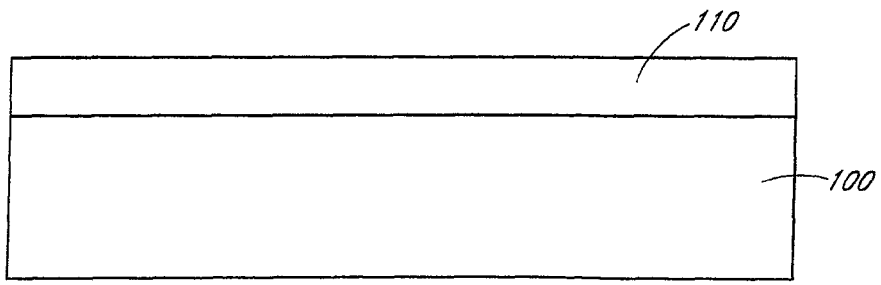

As shown in FIG. 3, a sacrificial layer 110 can be formed on the upper surface 102 of the silicon substrate 100. The sacrificial layer 110 can be composed of porous silicon, such as formed in a HF bath with bias. Alternatively, the sacrificial layer 110 can be silicon with, for example, germanium doping and/or a carbon doping, either of which can be formed by epitaxial deposition or a chemical vapor deposition (CVD) process. As used throughout, a CVD process refers to any variant of CVD, such as atmospheric pressure CVD (APCVD), plasma-enhanced CVD (PECVD), low pressure CVD (LPCVD), and so on. The desired CVD process for any particular fabrication step can be selected and used by one of ordinary skill in the art. Other dopants besides germanium and carbon can also be used. The sacrificial layer 110 can be thin, on the order of approximately 700 micrometers, although it can be slightly or significantly larger or smaller, as desired for a particular embodiment to perform the functions described herein. For example, in certain embodiments, the sacrificial layer can be as thin as 10 micrometers. Smaller thicknesses can also be used.

Figure 4:
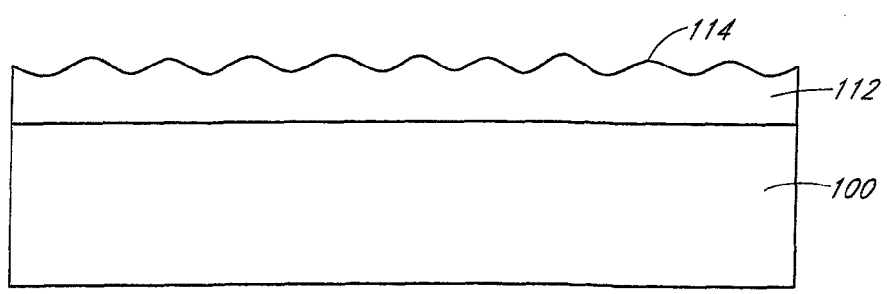

FIG. 4 illustrates the sacrificial layer 110 after a random texturing step, such as with a wet or dry etch process, including buffered oxide etching (BOE) to create an upper textured surface 114. One etchant that can be used is potassium hydroxide, KOH, although others can also be used in different embodiments. The textured surface 114 of the sacrificial layer 110 thus does not have a planar shape. In certain embodiments, the texture does not include exposure of the underlying silicon substrate 100, although in some embodiments, the silicon substrate 100 can be exposed through the sacrificial layer 110 if desired. The textured surface 114 of the sacrificial layer 110 can have a regular, repeating pattern, such as triangular or rectangular pyramids, or can have a randomly determined pattern. In either case, the sacrificial layer 110 can maintain the shape of the textured surface 114 during subsequent processing.

Figure 5:
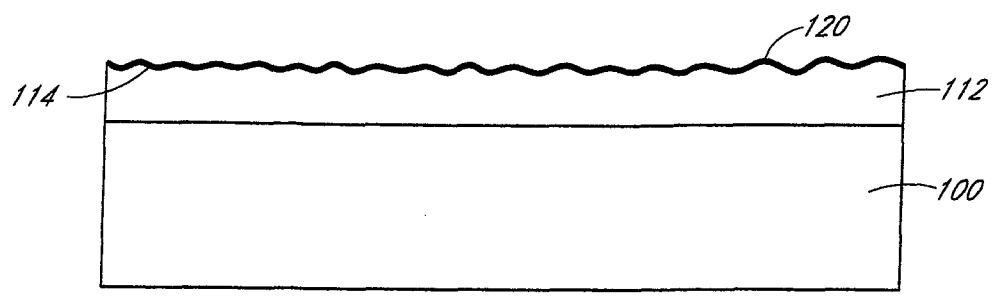

As shown in FIG. 5, a doped silicon layer 120 can be formed atop the textured surface 114. The doped silicon layer 120 can be deposited using any desired CVD process. The doped silicon layer can be N+ doped, and have a thickness of between 0.01 and 5 micrometers. In certain embodiments, the doped silicon layer 120 can be doped with germanium. In some embodiments, the dopant concentration can be approximately $1 \times 10^{17}$ atoms per cubic centimeter, while less or greater concentrations, up to $1 \times 10^{20}$ atoms per cubic centimeter or greater can also be used.

Figure 6:
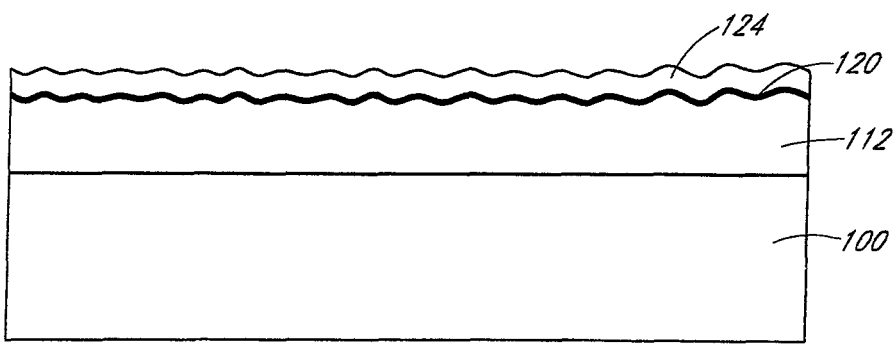

In certain embodiments, another doped layer of silicon, an N+ layer 124 can be formed on the doped silicon layer 120. FIG. 6 illustrates the formation of the N+ layer 124. Not all embodiments will include the N+ layer 124, but it is illustrated throughout. The N+ layer 124 can be deposited, such as through a CVD technique or grown using an epitaxial growth technique. The N+ layer 124 can be composed of a silicon-germanium composition, or a silicon-carbon material.

Relative to the thicker N+ layer 124, the doped silicon layer 120 can be heavily doped, often referred to as an N++ doped layer. In some embodiments, the N+ layer 120 can be referred to as a lightly doped layer, expressed relative to the higher-doped doped silicon layer 120. In certain embodiments, the N+ layer 124 can be relatively porous. In some embodiments, undoped silicon can be deposited atop the doped silicon layer 120. A subsequent thermal step can be used to drive dopants from the doped silicon layer 120 into the N+ layer 124, resulting in a relatively light doping of the N+ layer 124. The N+ layer 124 can be, when present, between 0.05 and 1 micrometers thick.

Figure 7:
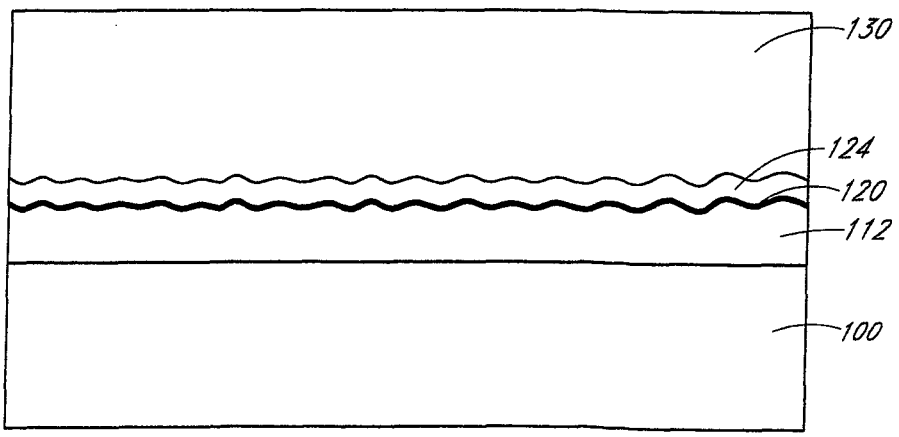

FIG. 7 illustrates the growth of a silicon film 130 atop the N+ layer 124 or, atop the doped silicon layer 120 when the N+ layer is omitted. The silicon film 130 can be relatively thick as compared to the accompanying layers in the overall structure of the finished solar cell. It can also be relatively thin as compared to the substrate 100, or a traditional solar cell wafer. A silicon film grown by an epitaxial deposition process can also be referred to as a thin silicon film, a thin silicon substrate, the epitaxially-grown substrate, or, more generally, as a grown silicon layer. The silicon film 130 can be formed by a epitaxial growth process, seeding and propagating a poly-silicon crystal structure on the exposed surface of the N+ layer 124. The silicon film 130 can be slightly N+ doped, such as a silicon-germanium substrate, or a silicon-carbon substrate. The silicon film 130 can, in some embodiments be a pure silicon substrate. In certain embodiments, the silicon film 130 can be porous silicon. In general, the exact composition of the silicon film 130 can be silicon or some doped silicon material or a compound of silicon sufficient to operate as a photovoltaic solar cell substrate in cooperation with the rest of the elements of the solar cell fabricated.

In some embodiments, a thermal heating step can follow the epitaxial growth of any layer or substance described herein, including growth of the silicon film 130 to sinter it. The silicon film 130 can be formed with a CVD process step. The silicon film 130 can be between 20 and 150 micrometers thick, and in some embodiments can be 50 micrometers thick. In some embodiments, the silicon film 130 is formed by a process which reduces the surface texture on its rear side. Thus, while the doped silicon layer 120 and N+ layer 124 can be relatively conformal, the thickness of the silicon film 130 can cause planarization, resulting in a relatively flat rear surface, the exposed surface.

Figure 8:
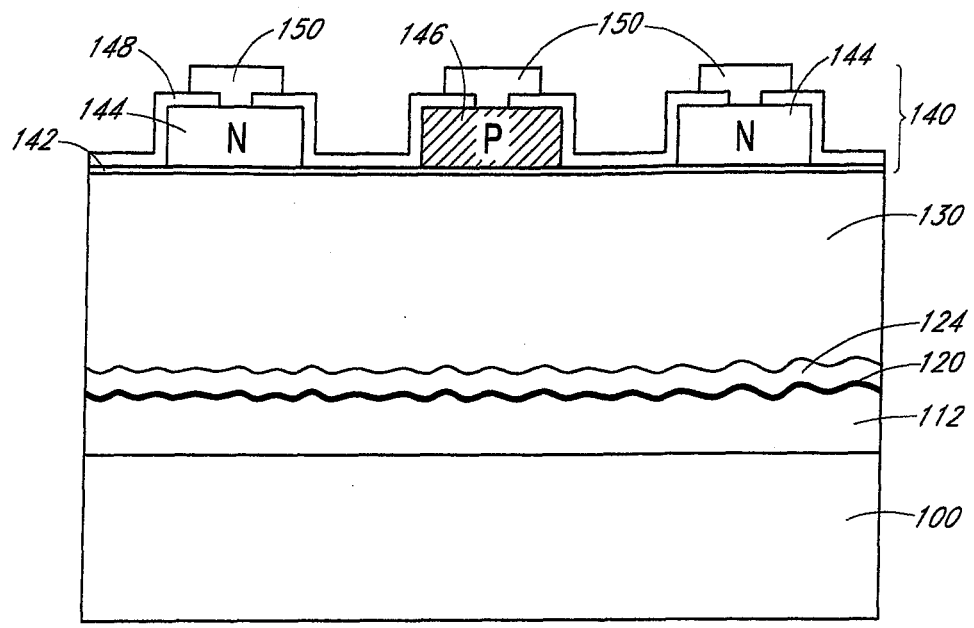

FIG. 8 illustrates the formation of a contact structure 140 on said exposed surface of the silicon film 130. The exact contact structure 140 can vary between embodiments. For example, in certain embodiments, the contact structure can include interdigitated doped polysilicon regions. The illustrated embodiment shows alternating N and P doped polysilicon regions, 144 and 146, respectively. Additionally, a thin oxide layer 142 can be present between the silicon film 130 and the doped polysilicon regions 144, 146, as described in U.S. Pat. Nos. 7,468,485 and 7,633,006 to Swanson, the entirety of which are incorporated by reference herein. The thin oxide layer 142 can function as a tunnel oxide, inhibiting recombination during carrier transport to the doped polysilicon regions 144, 146. The doped polysilicon regions 144, 146 can be formed using print, mask, and etch techniques, such as, without limitation, those described in U.S. Pat. Nos. 6,998,288 and 7,135,350 to Smith et al., and U.S. Pat. No. 7,820,475 to De Ceuster et al., the entirety of which are incorporated by reference herein.

In some embodiments, the doped polysilicon regions 144, 146 can be formed using an inkjet printing process. In such a process, an undoped polysilicon layer can be formed atop the thin oxide layer 142. An inkjet dopant deposition process can be used to precisely place the appropriate N and P dopant sources atop their respective polysilicon regions. A thermal drive step can follow, doping the N and P polysilicon regions 144, 146. A mask and etch step can then be used to remove the dopant source, as well as form the trenches between the polysilicon regions 144, 146. A detailed explanation of such a process of forming the contact structure 140 can be found in U.S. Pat. No. 7,812,250 to Smith, the entirety of which is incorporated by reference herein.

An insulating layer 148 can be formed over the doped polysilicon regions 144, including in the trenches therebetween. In addition to a single illustrated insulating layer 148, other insulating layers can also be formed in different embodiments. For example, in certain embodiments, silicon nitride or another back-side ARC can be formed as part of the process of forming the contact structure 140. Other passivating or insulating layers can also be formed during the formation of the contact structure 140. One or more contact holes or vias can be opened in the insulating layer 148 to permit formation of a contact plug 150 which electrically contacts the doped polysilicon regions 144, 146. In certain embodiments, the contact holes or vias can be opened with a mask and etch process, while in others a laser process can be used, as is known in the art. Similarly, although referred to as a contact plug 150, the contact plug 150 can refer to several stacked materials, such as those described in U.S. Pat. No. 7,388,147 to Mulligan et al., the entirety of which is incorporated by reference herein.

In some embodiments, the contact structure 140 can be of an entirely different type, such as that described in U.S. patent application Ser. No. 11/492,282, to De Ceuster et al., published as U.S. Patent Publication No. 2008/0017243, the entirety of which is incorporated by reference herein. Regardless of the specific components, elements, or features of the contact structure 140, a back-contact, back-junction architecture can be used, wherein the silicon film 130 serves as a silicon substrate for any of the structures described in any reference. In practicing such techniques, it will be observed that the front structure has already been formed, with a randomly-textured surface and an N+ doped region on the front or sunny side of the solar cell, the boundary of which is the doped silicon layer 120 currently bonded with the sacrificial layer 112.

In certain embodiments, the thermal steps required to produce the contact structure 140 can be used to complete dopant drive-in from the doped silicon layer 120 into the N+ layer 124 or silicon film 130. In some embodiments, dopants from the doped silicon layer 120 be driven into the silicon film 130 through the N+ layer 124 or, in other embodiments, they can be driven directly into the silicon film 130 because the N+ layer 124 has been omitted. Thus, one of skill in the art will appreciate that it may not be necessary to fully drive and activate the dopants in the doped silicon layer 120, N+ layer 124, or silicon film 130 during their respective formation steps if sufficient thermal processes will occur during formation of the contact structure 140.

Figure 9:
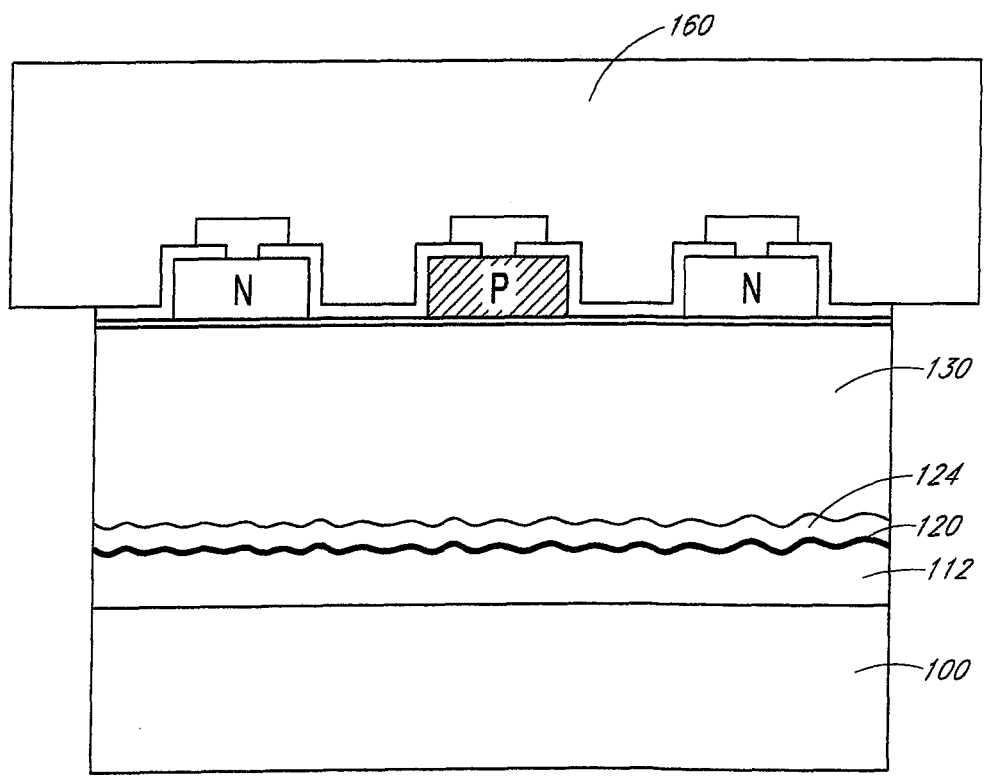

Thus, FIG. 8 illustrates a fully-formed contact structure 140. Although one embodiment of such a structure is shown, others can be used without deviating from the inventive techniques described herein. FIG. 9 illustrates a carrier element 160 which can be bonded to the exposed surface of the rear side of the silicon film 130. For example, the carrier element 160 can be bonded to the insulating layer 148 or the contact plugs 150, or both. The carrier element 160 can be any device or structure which has sufficient rigidly and, in some embodiments, flatness, to support the solar cell during the subsequent separation step. Thus, in some embodiments, the carrier element 160 can be a plastic surface, or a metal one, or so on. In some embodiments, the carrier element 160 can be bonded to multiple cells for separate all of them. The carrier element 160 can be bonded using any dissolvable or reversible bonding agent or adhesive. In certain embodiments, a permanent bond can be formed, including those which are not permanent, but have no corresponding debonding agents.

Figure 10:
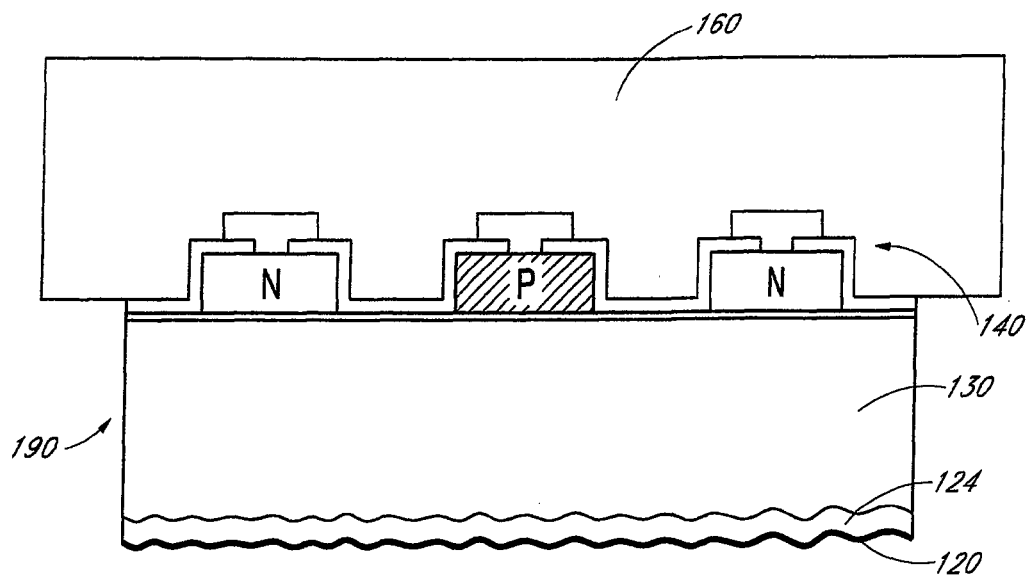

FIG. 10 illustrates the separation step wherein the sacrificial layer 112 is partially or fully destroyed, releasing the thin silicon solar cell 190 from the silicon substrate 100. Such a separation can be accomplished using, for example, a selective etch process, including wet etch processes. In certain embodiments, the sacrificial layer 112 is retained by the silicon substrate 100 for reuse. In such embodiments, the surface containing the sacrificial layer 112 can be washed or cleaned prior to re-use. In other embodiments, the sacrificial layer 112 is dissolved entirely, requiring that, if the silicon substrate is to be re-used, a new sacrificial layer 112 be formed. In certain embodiments, portions of the sacrificial layer 112 may not be removed during the separation process, which can be subsequently destroyed. Thus, the sacrificial layer 112 is not re-used in future fabrication steps, but it need not be entirely removed during the separation process. In some embodiments, the selective etchant use does not attack the components of the thin silicon solar cell 190.

Figure 11:
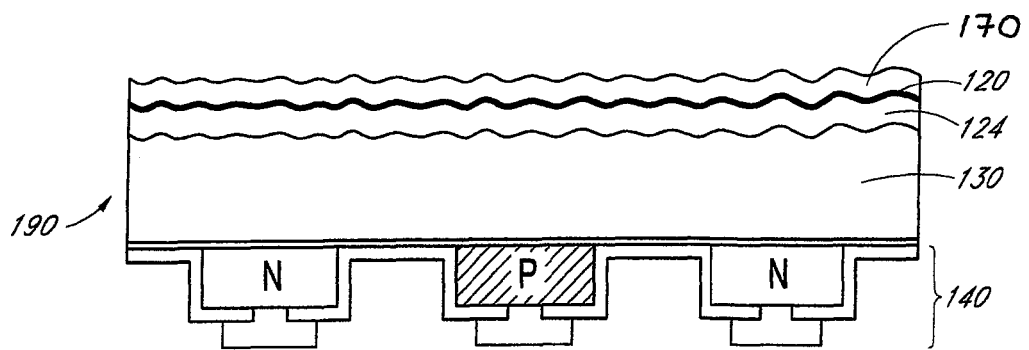

The surface of the doped silicon layer 120 is thus exposed. This surface can be washed and cleaned following the separation from the sacrificial layer 112. The doped silicon layer 120 now forms the uppermost layer on the sunny side of the thin silicon solar cell 190. FIG. 11 illustrates that an ARC layer 170 may be formed over the doped silicon layer 120, enhancing the performance of the thin silicon solar cell 190. In certain embodiments, a backside ARC, or BARC, can be formed as part of the process of forming the contact structure 140.

In certain embodiments, one or more fabrication steps can be omitted. For example, where the doped silicon layer 120 and the N+ layer 124 are both omitted, the front surface of the silicon film 130 is formed directly on the sacrificial layer 112. In such an embodiment, front-side passivation of the thin silicon solar cell 190 can be performed prior to or together with an ARC step. In certain embodiments, doping of the front side, or exposed side of the silicon film 130 can be performed after separating it from the sacrificial layer 112.

As shown in FIG. 11, the carrier element 160 can be released from the thin silicon solar cell 190 through any desired debonding process. Such a debonding process can include a solvent or etchant which attacks the adhesive or bonding agent coupling the thin silicon solar cell 190 to the carrier element 160. In certain embodiments, the rear side of the thin silicon solar cell 190 can be cleaned to remove remnants of the bonding process. The thin silicon solar cell 190 is now ready for further processing, such as stringing, interconnection, incorporating in a solar module, and so on. In some embodiments, the front ARC and BARC steps can be performed simultaneously at this point in the fabrication process. ARC or BARC materials can include nitrides, such as silicon nitride, deposited using a remote plasma deposition technique.

As can be seen, the thin silicon solar cell 190 has been fabricated without relying on a traditionally-created solar wafer, eliminating the potentially expensive additional steps of ingot creation and wafering.

Another advantageous feature of the present fabrication technique that can be appreciated is the formation of the textured front surface of the silicon film 130, specifically the textured doped silicon layer 120 and/or N+ layer 124. During some solar cell fabrication processes, texturizing the front surface of the cell includes an etch step for both front and back surfaces. In some embodiments, the contact structure formation steps must accommodate a destructive etch to the rear, contact surface. Thus, some techniques form protective structures for use over sensitive features of the rear surface during the texturizing etch. Having pre-textured the front surface, the now-exposed doped silicon layer 120, the contact structure 140 can be created without accommodating the destructive texturizing etch step. Removing this consideration can reduce the cost of forming the contact structure 140. In those embodiments where the destructive texturizing step is required for rear-side contact formation, it is possible to form a flat sacrificial layer, doped silicon layer 120, N+ layer 124, and silicon film 130. Only after separating from the sacrificial layer can the doped silicon layer 120 be texturized, including a texturing of the rear side, to prepare for BARC processing.

Figure 12:
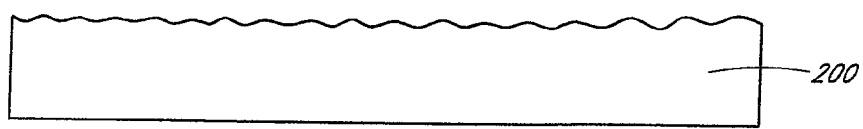
FIGS. 12-13 are cross-sectional representations of fabrication steps in accordance with another embodiment of the invention.
Figure 13:
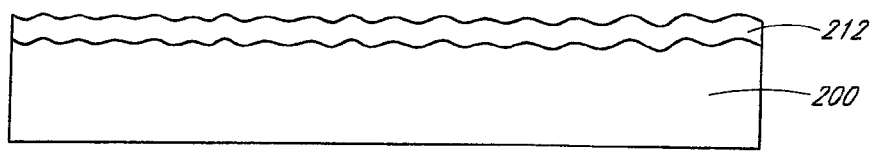

FIGS. 12 and 13 illustrate steps in an alternative process embodiment for the initial steps of fabrication for the thin silicon solar cell. As shown in FIG. 12, the silicon substrate 200 can itself have a textured surface. This textured surface can, in some embodiments, be doped to aid the use of it as a sacrificial layer. A doped silicon layer 212 can then be conformally formed atop the silicon substrate 200, imparting the textured shape to the doped silicon layer 212. In this way, the upper surface of the silicon substrate 200 can function as the sacrificial layer. During a separation step equivalent to that shown in FIGS. 9 and 10, the upper surface of the silicon substrate 200 can be attacked, releasing the thin silicon solar cell. The silicon substrate 200 can retain its textured shape, permitting re-use, after cleaning, by the formation of a new doped silicon layer 212 atop it.

As was previously mentioned, the steps of the fabrication process can be carried out in the described and illustrated order, or in other permutations. For example, in one embodiment of the fabrication steps, the solar cell can be separated from the silicon substrate by partially or entirely destroying the sacrificial layer prior to completing formation of the contact structure.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method, comprising:
    epitaxially depositing a sacrificial layer on a silicon substrate;
    forming a doped silicon layer on the sacrificial layer;
    forming a silicon film on the doped silicon layer;
    forming an insulating layer on the silicon film;
    forming alternating P-type and N-type doped regions in the silicon film, wherein the alternating P-type and N-type doped regions include at least one P-type doped region and at least one N-type doped region;
    contacting the P-type and N-type doped regions with a metal contact; and
    removing the sacrificial layer.

2. The method of claim 1, wherein said epitaxially depositing the sacrificial layer includes epitaxially depositing the sacrificial layer that includes a group IV element.

3. The method of claim 1, wherein said forming the doped silicon layer and said forming the silicon film includes epitaxially growing the doped silicon layer and the silicon film.

4. The method of claim 1, further comprising texturizing a surface of the sacrificial layer prior to said forming the doped silicon layer.

5. The method of claim 4, wherein forming the doped silicon layer comprises forming a layer of doped silicon conforming to the textured surface of the sacrificial layer.

6. The method of claim 1, further comprising texturizing a surface of the silicon substrate prior to said epitaxially depositing the sacrificial layer.

7. The method of claim 1, wherein said forming the doped silicon layer on the sacrificial layer includes forming a heavily doped silicon layer and a lesser doped silicon layer on the sacrificial layer.

8. A solar cell fabricated according to the method of claim 1.

9. A method of fabricating a solar cell, comprising:
    epitaxially forming a sacrificial layer on a top surface of a silicon substrate;
    epitaxially forming a silicon layer atop the sacrificial layer;
    forming alternating P-type and N-type doped regions in the epitaxially formed silicon layer;
    contacting each of the P-type and N-type doped regions with a metal contact;
    bonding a back side of the solar cell to a carrier;
    separating the epitaxially formed silicon layer from the silicon substrate; and
    debonding the solar cell from the carrier.

10. The method of claim 9, further comprising forming an anti-reflective coating over the epitaxially formed silicon layer.

11. A solar cell fabricated according to the method of claim 9.

* * * * *